(12) United States Patent
Liu et al.

(10) Patent No.: US 6,972,049 B2
(45) Date of Patent: Dec. 6, 2005

(54) METHOD FOR FABRICATING A DIAMOND FILM HAVING LOW SURFACE ROUGHNESS

(75) Inventors: Ping-Yin Liu, Yungho (TW);
Chun-Hao Hsieh, Taipei (TW);
Chin-Hon Fan, Miao Li Hsien (TW);
Hung-Yin Tsai, Taipei (TW);
Chien-Chang Su, Kaohsiung (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 160 days.

(21) Appl. No.: 10/635,606

(22) Filed: Aug. 7, 2003

(65) Prior Publication Data
US 2005/0028728 A1    Feb. 10, 2005

(51) Int. Cl.$^7$ ............................................. C30B 25/12
(52) U.S. Cl. ......................................... 117/86; 117/84
(58) Field of Search ..................................... 117/84, 86

(56) References Cited

U.S. PATENT DOCUMENTS

| | | | | |
|---|---|---|---|---|
| 5,370,944 A | * | 12/1994 | Omori et al. | 428/565 |
| 5,952,102 A | * | 9/1999 | Cutler | 428/408 |
| 6,054,183 A | * | 4/2000 | Zimmer et al. | 427/249.8 |

* cited by examiner

Primary Examiner—Felisa Hiteshew
(74) Attorney, Agent, or Firm—Rabin & Berdo, P.C.

(57) ABSTRACT

A process for making a diamond film with low surface roughness. A substrate is provided. A diamond layer is deposited on the substrate. A binder layer is coated over the diamond layer. A carrier plate is provided to join with the binder layer, thereby forming a laminate structure. The substrate is then removed, thereby obtaining a diamond film with a low surface roughness with respect to the surface roughness of the removed substrate.

22 Claims, 4 Drawing Sheets

METHOD FOR FABRICATING A DIAMOND FILM HAVING LOW SURFACE ROUGHNESS

BACKGROUND OF THE INVENTION

1. Field of the Invention

The present invention relates to a method for fabricating a diamond film having low surface roughness. More particularly, the present invention relates to a method for fabricating a diamond film having low surface roughness and products made thereof that are suited for surface acoustic wave (SAW) filters, transfer printing heads, and/or nano-scale transfer printing applications.

2. Description of the Related Art

Synthesized diamond films have been widely used in various industry fields such as traditional cutting tools and light communication devices because of the superior physical and chemical characteristics thereof. Typically, diamond films are deposited on a substrate using hot filament chemical vapor deposition (HF CVD) or plasma-assisted CVD. However, the average surface roughness of the diamond films either made by using the HF CVD or plasma-assisted CVD does not meet the restrict requirement of sophisticated electric components. In general, the average surface roughness of the diamond films either made by using the HF CVD or plasma-assisted CVD is about several microns.

Reference is made to FIG. 1, which is a schematic cross-sectional view illustrating a diamond film fabricated according to the prior art. The diamond film 20a is deposited on a support substrate 10a. After deposition of the diamond film 20a, a polishing process is typically carried out to obtain a planar diamond surface with low surface roughness. For example, the polishing process may be mechanical polishing, ion beam processing, chemical assisted polishing, or thermal chemical mechanical processing, and the like.

However, the above-described prior art diamond surface polishing processes still has several drawbacks. After treatment with a conventional mechanical energy or ion beam polishing processes, the surface roughness of the diamond surface can only be improved by several microns. Further, the prior art diamond surface polishing processes is time consuming. Typically, it takes several days to finish a batch of diamond film products. Moreover, the equipment required for the conventional diamond surface polishing processes is costly.

SUMMARY OF THE INVENTION

Accordingly, the primary object of the present invention is to provide a process for making a diamond film with low surface roughness.

Another object of the present invention is to provide a simplified process for making diamond films, which is cost effective and time saving.

Still another object of the present invention is to provide a process for making diamond film with low surface roughness and microstructure.

To achieve these and other advantages and in accordance with the purposes of the present invention, as embodied and broadly described herein, the present invention provides a process for making a diamond film with low surface roughness, comprising providing a substrate, depositing a diamond layer on the substrate, coating a binder layer over the diamond layer, providing a carrier plate joining with the binder layer, thereby forming a laminate structure, and removing the substrate. A diamond film with a low surface roughness with respect to the surface roughness of the removed substrate is thereby obtained.

The present invention also discloses a process for fabricating a diamond film structure with low surface roughness, comprising providing a substrate, depositing a diamond layer on the substrate, coating a conductive layer over the diamond layer, forming a metal layer on the conductive layer and removing the substrate. A diamond film with a low surface roughness with respect to the surface roughness of the removed substrate is thereby obtained.

The present invention, the present invention further discloses a process for making a diamond film with low surface roughness, comprising providing a support substrate and a carrier plate, each of which has a corresponding deposition face. The support substrate and the carrier plate are arranged so that there is a constant spacing between the depositing face of the support substrate and the depositing face of the carrier plate. Chemical vapor deposition is performed in the spacing to form a diamond layer between the depositing face of the support substrate and the depositing face of the carrier plate. The support substrate is then moved, thereby obtaining a diamond film with a low surface roughness with respect to the surface roughness of the removed substrate.

BRIEF DESCRIPTION OF THE DRAWINGS

Other objects, advantages and novel features of the invention will become more clearly and readily apparent from the following detailed description when taken in conjunction with the accompanying drawings, in which.

DETAILED DESCRIPTION OF THE PREFERRED EMBODIMENTS

The present invention pertains to a method for fabricating a diamond film with a relatively low average surface roughness compared to the diamond film made by the prior art method. The present invention method substitutes joining techniques and etching techniques for the prior art mechanical energy or energy ion beam polishing methods. According to the present invention method, a large area, low surface roughness diamond film surface can be obtained with low cost. The manufacturing processes thereof are simplified. No complex and costly equipment is required. A great deal of processing time is also saved.

Figure 1:
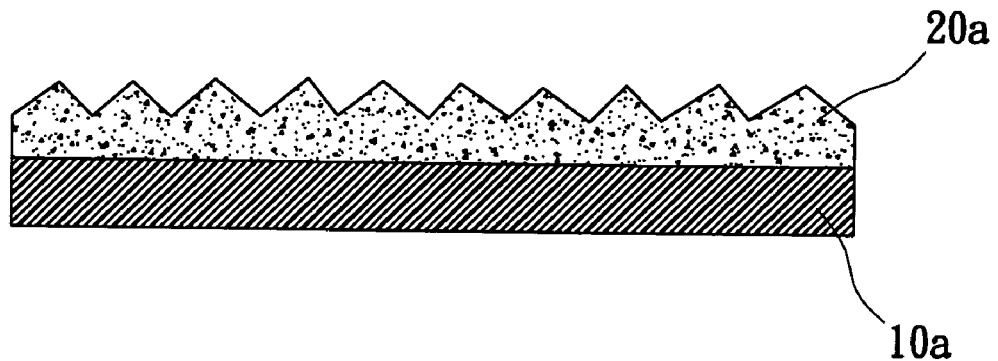
FIG. 1 is a schematic cross-sectional view illustrating a diamond film fabricated according to the prior art.
Figure 3:
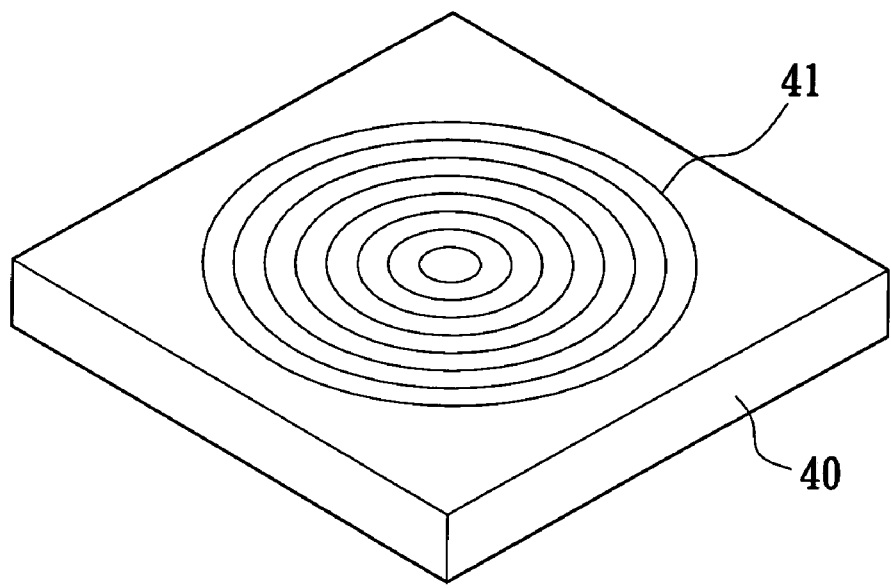
FIG. 3 illustrates a joining face of the carrier plate according to the present invention.
Figure 2A:
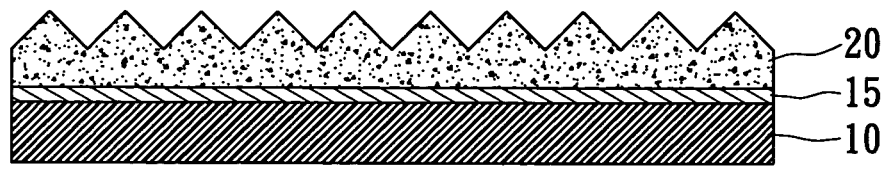
FIG. 2A to FIG. 2D are schematic cross-sectional diagrams showing the first preferred embodiment of the present invention.
Figure 2B:
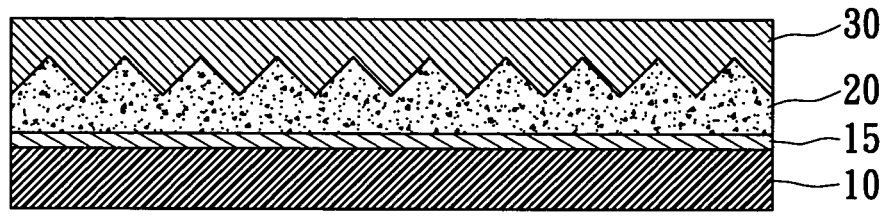
Figure 2C:
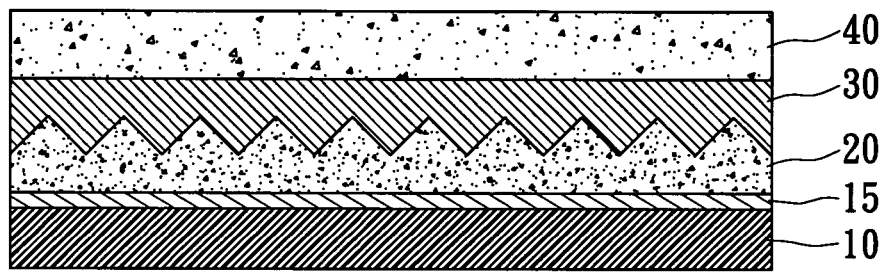
Figure 2D:
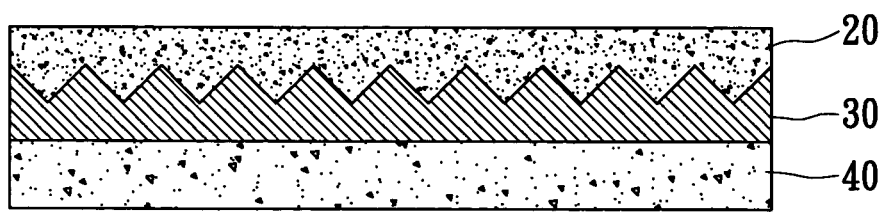
Figure 4A:
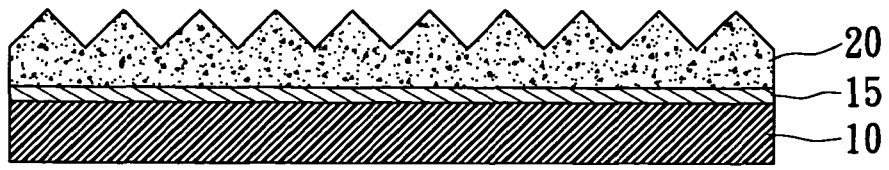
FIG. 4A to FIG. 4D are schematic cross-sectional diagrams showing the second preferred embodiment of the present invention.
Figure 4B:
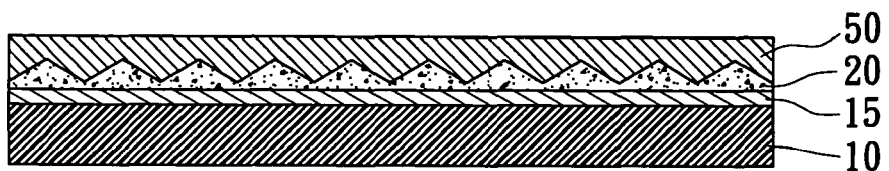
Figure 4C:
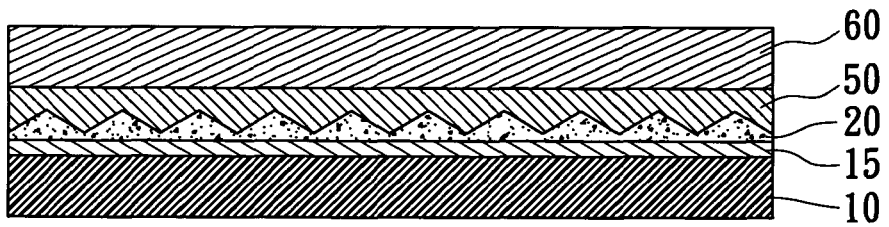
Figure 4D:
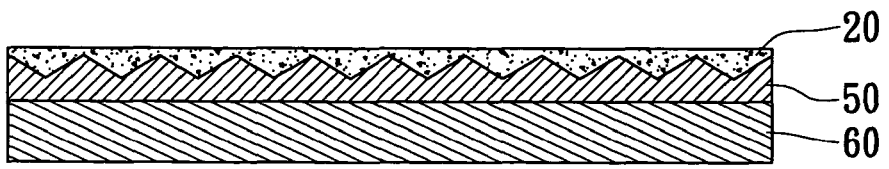

Referring initially to FIG. 2A to FIG. 2D, a support substrate 10 having a main surface with low surface roughness is provided. The support substrate 10 is made of silicon, Mo alloys, graphite, WC or similar materials. An intermediate layer 15 is sputtered onto the main surface of the support substrate 10. The thickness of the intermediate layer 15 is about several nanometers. Preferably, the intermediate layer 15 is made of aluminum nitride or silicon carbide. Subsequently, a chemical vapor deposition (CVD) process is carried out to deposit a diamond film 20 on the intermediate layer 15. A binder layer 30 is coated on the diamond film 20. The binder layer 30 comprises binders such as polymer composite materials, sol-gel, epoxy, UV resins, glass binders, or metal composites. After coating the binder layer 30, a carrier plate 40 and the binder layer 30 are joined together. It is noted that if the binder layer 30 is made of UV resins, the carrier plate 40 should be a transparent plate such as a quartz plate such that UV light can penetrate through the transparent carrier plate 40 to the subjacent binder layer 30. Thereafter, the support substrate 10 and the intermediate layer 15 are removed by a wet chemical such as KOH or HNA, which process is known in the art. Dry etching methods for removing the support substrate 10 and the intermediate layer 15 are also practicable. As indicated in FIG. 2D, after reversing the composite film stack shown in FIG. 2C, a diamond film with low surface roughness is obtained. In this method, the intermediate layer 15 serves as a buffer layer between the support substrate 10 and the diamond film 20 to avoid peeling due to difference in thermal expansion coefficient. It is noted that before joining the carrier plate 40 to the binder layer 30, several concentric circles of micro trenches 41 are etched into the joining face of the carrier plate 40, as shown in FIG. 3. These concentric circles of micro trenches 41 can alleviate micro distortion due to heat extension of the diamond film 20, the binder layer 30 and the carrier plate 40, and thus preventing peeling of the diamond film 20 from the carrier plate 40. In some cases, the intermediate layer 15 may be omitted.

Referring to FIG. 4A to FIG. 4D, a support substrate 10 having a main surface with low surface roughness is provided. An intermediate layer 15 is sputtered onto the main surface of the support substrate 10. Subsequently, a chemical vapor deposition (CVD) process is carried out to deposit a diamond film 20 on the intermediate layer 15. A conductive layer 50 is sputtered on the diamond layer 20. The conductive layer 50 may be made of Ni, NiCo, TiNi, or Al, but is not limited thereto. Thereafter, a metal layer 60 such as Ni is electrically plated on the conductive layer 50 to form a laminate structure (substrate 10/intermediate layer 15/diamond film 20/conductive layer 50/metal layer 60). Finally, the substrate 10 and the intermediate layer 15 are removed to form a diamond film with a low surface roughness. Likewise, the intermediate layer may be omitted.

Figure 5A:
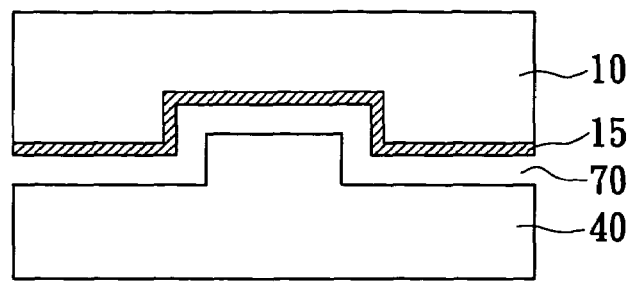
FIG. 5A to FIG. 5D are schematic cross-sectional diagrams showing the third preferred embodiment of the present invention.
Figure 5B:
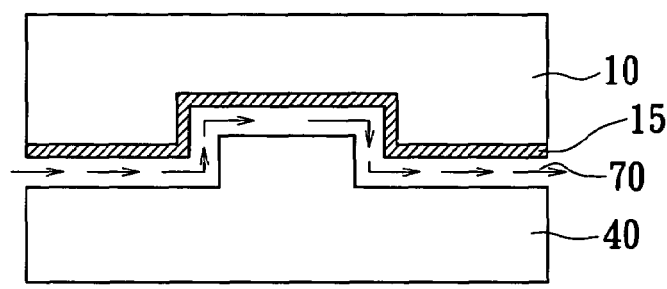
Figure 5C:
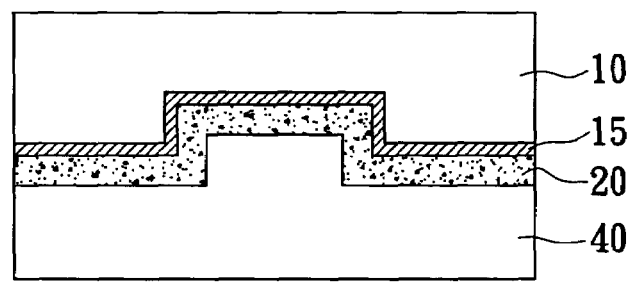
Figure 5D:
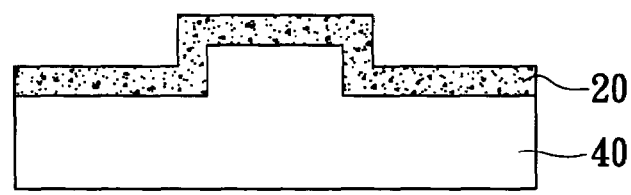

Referring to FIG. 5A to FIG. 5D, a support substrate 10 with a recess structure is provided. A carrier plate 40 having a protruding structure corresponding to the recess structure of the support substrate 10 is arranged under the support substrate 10. An intermediate layer 15 is sputtered on the main surface of the support substrate 10 in advance. The spacing 70 between the support substrate 10 and the carrier plate 40 is substantially equal to the thickness of the diamond layer to be formed. After fixing the positions of the support substrate 10 and the carrier plate 40, a chemical vapor deposition process is carried out to deposit a diamond layer in the spacing between the intermediate layer 15 and the deposition surface of the carrier plate 40, as shown in FIG. 5C. Finally, the support substrate 10 and the intermediate layer 15 are removed, thereby forming a diamond film 20 with low surface roughness.

The intermediate layer 15 serves as a buffer layer between the support substrate 10 and the diamond film 20 to avoid peeling due to thermal expansion. It is noted that several concentric circles of micro trenches 41 are etched into the carrier plate 40. These concentric circles of micro trenches 41 can alleviate micro distortion due to heat extension of the diamond film 20 and the carrier plate 40, and thus preventing peeling of the diamond film 20 from the carrier plate 40. In some cases, the intermediate layer 15 may be omitted.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A process for making a diamond film with low surface roughness, comprising:
   providing a substrate;
   depositing a diamond layer on the substrate;
   coating a binder layer over the diamond layer;
   providing a carrier plate joining with the binder layer, thereby forming a laminate structure; and
   removing the substrate, thereby obtaining a diamond film with a low surface roughness with respect to a surface roughness of the removed substrate.

2. The process for making a diamond film with low surface roughness according to claim 1, wherein the binder layer is made of low temperature binding agent.

3. The process for making a diamond film with low surface roughness according to claim 1, wherein before depositing the diamond layer, an intermediate layer is deposited on the substrate, and the diamond layer is then deposited on the intermediate layer.

4. The process for making a diamond film with low surface roughness according to claim 3, further comprising a step of removing the intermediate layer.

5. The process for making a diamond film with low surface roughness according to claim 1, wherein the carrier plate has a joining face whereon a plurality of micro trenches is formed.

6. The process for making a diamond film with low surface roughness according to claim 1, wherein the binder layer is made of UV resin, the carrier plate is transparent, and the step of joining the carrier plate and the binder layer comprises:
   placing the carrier plate on the binder layer; and
   exposing the binder layer to UV light penetrating through the carrier plate.

7. The process for making a diamond film with low surface roughness according to claim 1, wherein the method of removing the substrate includes wet etching processes.

8. The process for making a diamond film with low surface roughness according to claim 1, wherein the method of removing the substrate includes dry etching processes.

9. A process for making a diamond film with low surface roughness, comprising:
   providing a substrate;
   depositing a diamond layer on the substrate;
   coating a binder layer over the diamond layer;
   providing a carrier plate joining with the binder layer, thereby forming a laminate structure; and
   removing the substrate, thereby obtaining a diamond film with a low surface roughness with respect to a surface roughness of the removed substrate;
   wherein the binder layer is made of a photosensitive resin, and the carrier plate is transparent.

10. The process for making a diamond film with low surface roughness according to claim 9, wherein the photosensitive resin is UV resin.

11. process for making a diamond film with low surface roughness according to claim 9, wherein the carrier plate is a quartz plate.

12. A process for fabricating a diamond film structure with low surface roughness, comprising:
providing a substrate;
depositing a diamond layer on the substrate;
coating a conductive layer over the diamond layer;
forming a metal layer on the conductive layer; and
removing the substrate, thereby obtaining a diamond film with a low surface roughness with respect to a surface roughness of the removed substrate.

13. The process for fabricating a diamond film structure with low surface roughness according to claim 12, wherein the conductive layer is coated on the diamond layer by sputtering.

14. The process for fabricating a diamond film structure with low surface roughness according to claim 12, wherein the metal layer is formed on the conductive layer by electrically plating.

15. The process for fabricating a diamond film structure with low surface roughness according to claim 12, wherein the method of removing the substrate includes wet etching processes.

16. The process for fabricating a diamond film structure with low surface roughness according to claim 12, wherein the method of removing the substrate includes dry etching processes.

17. A process for making a diamond film with low surface roughness, comprising:
providing a support substrate and a carrier plate, each of which has a corresponding deposition face;
arranging the support substrate and the carrier plate to a manner that there is a constant spacing between the depositing face of the support substrate and the depositing face of the carrier plate;
performing a chemical vapor deposition process in the spacing to form a diamond layer between the depositing face of the support substrate and the depositing face of the carrier plate; and
removing the support substrate, thereby obtaining a diamond film with a low surface roughness with respect to the surface roughness of the removed substrate.

18. The process for making a diamond film with low surface roughness according to claim 17, further comprising a step of sputtering an intermediate layer on the deposition face of the support substrate, and then depositing the diamond layer on the intermediate layer and on the deposition face of the carrier plate.

19. The process for making a diamond film with low surface roughness according to claim 18, wherein the step of removing the substrate includes removal of the intermediate layer.

20. The process for making a diamond film with low surface roughness according to claim 17, wherein the carrier plate includes a plurality of micro trenches.

21. The process for making a diamond film with low surface roughness according to claim 17, wherein the method of removing the substrate includes wet etching processes.

22. The process for making a diamond film with low surface roughness according to claim 17, wherein the method of removing the substrate includes dry etching processes.

* * * * *